United States Patent [19]

Ando et al.

[11] Patent Number: 4,866,310
[45] Date of Patent: Sep. 12, 1989

[54] CLOCK SIGNAL GENERATOR

[75] Inventors: Hideki Ando; Takeo Nakabayashi, both of Hyogo, Japan

[73] Assignee: Mitsubishi Denki Kabushiki Kaisha, Tokyo, Japan

[21] Appl. No.: 113,309

[22] Filed: Oct. 28, 1987

[30] Foreign Application Priority Data

Oct. 28, 1986 [JP] Japan .............................. 61-257352

[51] Int. Cl.$^4$ ................... H03K 19/003; H03K 19/08
[52] U.S. Cl. .................................. 307/480; 307/269; 307/303; 307/443; 307/491
[58] Field of Search ............... 307/480, 491, 443, 219, 307/269, 303

[56] References Cited

U.S. PATENT DOCUMENTS 4,417,158  11/1983  Ito et al. ............................... 307/269
4,477,738  10/1984  Kouba .................................. 307/480
4,514,647   4/1985  Shoji ................................... 307/269

OTHER PUBLICATIONS

B. Cassidy et al, "Dynamic MOSFET Logic Clock Driver", IBM Technical Disclosure Bulletin, vol. 22, No. 3, Aug. 1979, pp. 1093-1094.
N. Heckt, "Two-Phase Clock Features Nonoverlapping Outputs", Electronics, Jan. 20, 1977, p. 99.
"Introduction to VLSI", by Mead and Conway, second printing, Oct. 1980, published by Addison-Wesley Publishing Co., Inc., pp. 229-234.

Primary Examiner—John Zazworsky
Attorney, Agent, or Firm—Sughrue, Mion, Zinn, Macpeak & Seas

[57] ABSTRACT

The clock signal generator for generating non-overlapping polyphase clock pulses having no overlapping period of time where the clock pulses have a high level at the same time, comprises a clock signal generation control means provided for each of the polyphase clock pulses so that a clock signal on a signal path where the largest delay is caused among at the signal paths of one phase is used to prevent clock signal generation in the other phases.

2 Claims, 2 Drawing Sheets

FIG. 1
PRIOR ART
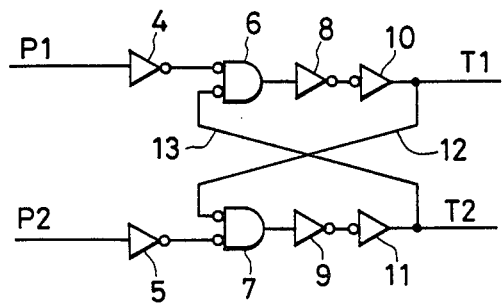
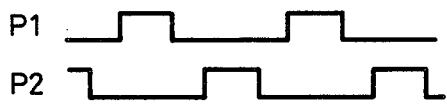
FIG. 2A
FIG. 2B
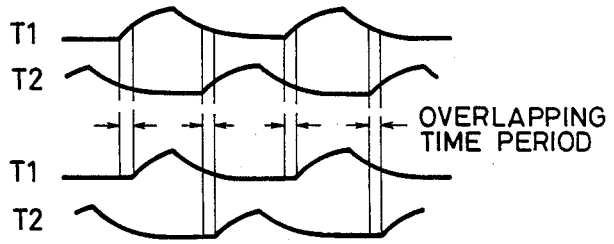
FIG. 2C
FIG. 2D

CLOCK SIGNAL GENERATOR

BACKGROUND OF THE INVENTION

1. Field of the Invention

The present invention relates to clock signal generators, and more particularly to a clock signal generator in which a non-overlapping property of non-overlapping clock pulses can be ensured throughout a network of clock signal lines existing on an entire semiconductor chip.

2. Prior Art

FIG. 1 shows a conventional logic circuit of an output stage of a clock signal generator. In FIG. 1, the logic circuit is constituted by inverters 4, 5, 8, 9, 10 and 11, and 2-input NOR gates 6 and 7. 2-phase non-overlapping clock pulses P1 and P2 formed in a pre-stage block of the clock signal generator are applied respectively to the inverters 4 and 5 and 2-phase non-overlapping clock pulses T1 and T2 are distributed to a network of clock signal lines throughout the entire semiconductor. Having no essential relevance to the present invention, the pre-stage for generating the clock pulses P1 and P2 is omitted in the drawing.

Next, the operation of the clock signal generator will be described. Assume that the 2-phase non-overlapping clock pulses P1 and P2 have such waveforms as illustrated in FIG. 2A. If the clock pulses are driven so as to be distributed directly on clock signal lines throughout the entire semiconductor chip, the waveforms of the clock pulses are dulled as illustrated in FIG. 2B because of load capacitance of the respective clock signal lines of the clock pulses T1 and T2. Accordingly, it is required to properly design the circuit on the basis of proper estimation of the load capacitance so that the clock pulses do not have any time period where both the clock pulses become "H" at the same time (hereinafter referred to as "overlapping time period") even if the waveforms of the clock pulses T1 and T2 are dulled. However, it is difficult to properly estimate the parasitic capacity in the stage of designing a circuit arrangement, and if a mistake is caused in design an overlapping time period is caused as illustrated in FIG. 2C. In order to cope with such a mistake in design, the circuit of FIG. 1 is so arranged that the clock pulses T1 and T2 are cross-coupled through the 2-input NOR gates 6 and 7 and lines 12 and 13 so as to prevent the clock pulse T2 from becoming "H" when the clock pulse T1 is "H" and to prevent the clock pulse T1 from becoming "H" when the clock pulse T2 is "H". Accordingly, no overlapping time period occurs in the arrangement of FIG. 1 as illustrated in FIG. 2D.

In the clock signal generator of FIG. 1, however, there is such a problem that the load connected to the clock signal lines for the clock pulses T1 and T2 are not always completely capacitive but generally has a resistive component so that the dulling of the waveforms of the clock pulses are different between a position where the clock pulses are generated and another position separated far away from the first mentioned position, and therefore the non-overlapping property cannot be always ensured in the whole chip region by the arrangement of FIG. 1.

SUMMARY OF THE INVENTION

It is an object of the present invention to solve the problem as described above.

It is another object to provide a clock signal generator in which the non-overlapping property can be ensured in a network of clock signal lines across the entire semicondutor.

In order to attain the above objects, according to the present invention, the clock signal generator for generating non-overlapping polyphase clock pulses having no overlapping period of time where the clock pulses have a high level at the same time, comprises a clock signal generation control means provided for each of the polyphase clock pulses so that a clock signal on a signal path where the largest delay is caused among all the signal paths of one phase is used to prevent clock signal generation in the other phases.

BRIEF DESCRIPTION OF THE DRAWINGS

FIG. 1 is a diagram showing a conventional logic circuit of an output stage of a clock signal generator;

FIGS. 2A through 2D are diagrams showing waveforms of clock pulses, respectively;

DESCRIPTION OF THE PREFERRED EMBODIMENT

Figure 3:
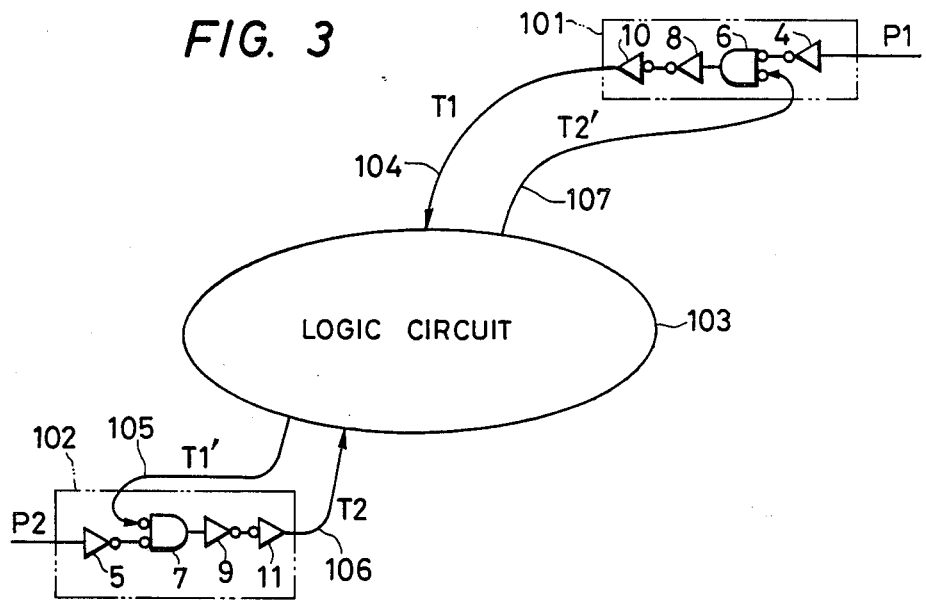
FIG. 3 is a block diagram showing a clock signal generator according to an embodiment of the present invention.

Referring to the drawings, an embodiment of the present invention will be described hereunder. FIG. 3 shows an embodiment of the clock signal generator according to the present invention. In FIG. 3, the clock signal generator is constituted by output stages 101 and 102 (that is, clock signal generation control means which are hereinafter referred to as "driver units") and a logic circuit 103 controlled by clock pulses T1 and T2.

A clock pulse P1 formed in a pre-stage of the clock signal generator and applied to the driver unit 101 is transferred to the logic circuit 103 after being driven through the driver unit 101. The clock signal line for a clock pulse T1 has a load which is not completely capacitive but which has a resistive component. Accordingly, the waveform of a clock pulse T1' at a point 105 is made duller than the waveform of the clock pulse T1 at a point 104. Accordingly, the clock pulse T1' led out at the point 105 is applied to a NOR gate 7 of the driver unit 102 so that the non-overlapping property can be ensured between the clock pulses T2 and T1' at the points 106 and 105, respectively. Similarly to this, the non-overlapping property can be ensured between the clock pulses T1 and T2' at the points 104 and 107 respectively.

Figure 4A:
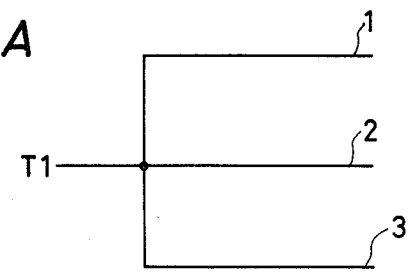
FIGS. 4A and 4B are diagrams showing a clock network and an equivalent circuit of the clock network, respectively.
Figure 4B:
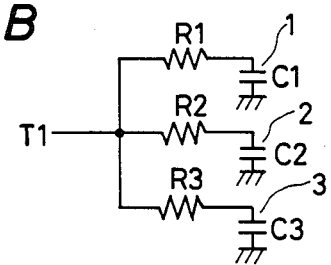

Generally, clock signal lines are formed in the form of a network over the entire semiconductor chip. As a simple example, assume now that signal lines 1, 2 and 3 are provided as shown in FIG. 4A. The circuit of FIG. 4A can be equivalently expressed as illustrated in FIG. 4B. The respective delays from the source of the clock pulse T1 are R1·C1, R2·C2, and R3·C3 at points 1, 2 and 3 in FIG. 4B. In this manner, the states of signal propagation at the respective terminal points of the clock signal line network are different from each other depending on the passages of the signal propagation. Further, the larger the transmission delay a point has, the duller the waveform at that point is made correspondingly.

Accordingly, assume now that the circuit of FIG. 3 is so arranged that the signal propagation delay is the largest at the point 105 among the terminal points of the signal line network for the clock pulse T1 and at the point 107 among the terminal point of the signal line network for the clock pulse T2. Then, the non-overlapping property can be ensured between the clock pulses T1' and T2' which are dulled with the utmost extent and therefore can be ensured among the clock pulses over the whole chip region.

Although the above embodiment has been illustrated about the case of 2-phase clock pulses, the present invention is not limited to this but applicable to the case of 3-phase or 4-phase non-overlapping clock pulses with the same effects if the clock signal generator is arranged on the basis of the same consideration.

The driver units 101 and 102 of FIG. 3 may be replaced by any other logical circuits so long as the logic circuits are equivalent to the driver units 101 and 102.

Although the above-mentioned embodiment shows the case where only the driver is divided into two driver units, the present invention if not limited to this but applicable to the case where the whole of the clock signal generator is divided into two sections.

Further, although the clock signal driver units are disposed at different positions in the arrangement of FIG. 3, the driver units may be located at any positions so long as a clock signal on a signal path where the signal transmission delay is the largest of all the signal paths in a certain phase is applied to a driver of another phase so as to prevent generation of a clock signal of the other phase.

As described above, the clock signal generator according to the present invention has such a meritorious effect that the non-overlapping property can be ensured over the whole chip region, because the clock signal generator is arranged such that a clock signal on a signal path where the signal transmission delay is the largest of all the signal paths in a certain phase is applied to a driver of another phase so as to prevent generation of a clock signal of the other phase.

What is claimed is:

1. A clock signal generator systems for a logic circuit having a network of clock signal paths with known delays, mutual signal path having at least one logic circuit input node and one logic circuit output node, said system comprising:

a plurality of clock generators, each generating clock signals having a phase different from a phase of clock signals generated from any other clock generator, and the clock signals generated from each of said plurality of clock generators being applied to a respective input node of said logic circuit; and means coupled to said clock generators and at least one of said respective input and output nodes of each signal path for preventing the clock signals generated from each of said plurality of clock generators from being applied to said logic circuit for a predetermined period of time when said logic circuit already is receiving a clock signal from any other of said clock generators.

wherein said preventing means is connected between said logic circuit and said plurality of clock generators, said preventing means comprising means for passing to said logic means a predetermined clock signal having a largest delay of signal transmission of all of said clock signals in each phase of said clock signals generated from any other of said clock generators.

2. A clock signal generator system as claimed in claim 1, wherein said means for preventing comprises a NOR gate.

* * * * *